United States Patent
Ting et al.

(10) Patent No.: US 10,121,821 B2
(45) Date of Patent: Nov. 6, 2018

(54) BIASED BACKSIDE ILLUMINATED SENSOR SHIELD STRUCTURE

(71) Applicant: Taiwan Semiconductor Manufacturing Company, Ltd., Hsinchu (TW)

(72) Inventors: Shyh-Fann Ting, Tainan (TW); Feng-Chi Hung, Chu-Bei (TW); Jhy-Jyi Sze, Hsinchu (TW); Ching-Chun Wang, Tainan (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 15/477,976

(22) Filed: Apr. 3, 2017

(65) Prior Publication Data

US 2017/0207261 A1    Jul. 20, 2017

Related U.S. Application Data

(62) Division of application No. 14/278,941, filed on May 15, 2014, now Pat. No. 9,614,000.

(51) Int. Cl.
*H01L 27/146* (2006.01)

(52) U.S. Cl.
CPC ...... *H01L 27/1469* (2013.01); *H01L 27/1462* (2013.01); *H01L 27/1464* (2013.01); *H01L 27/14623* (2013.01); *H01L 27/14634* (2013.01); *H01L 27/14636* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 7,582,502 B1 | 9/2009 | Hwang et al. | |
| 7,714,403 B2 | 5/2010 | Lee et al. | |
| 9,123,617 B2 | 9/2015 | Wan et al. | |
| 9,136,304 B2 | 9/2015 | Maeda | |
| 9,799,695 B2 * | 10/2017 | Umebayashi | H01L 27/14632 |
| 9,871,148 B2 * | 1/2018 | Mizuta | H01L 27/14623 |
| 2005/0104148 A1 | 5/2005 | Yamamoto et al. | |
| 2006/0043438 A1 | 3/2006 | Holm et al. | |
| 2006/0076590 A1 | 4/2006 | Pain et al. | |
| 2008/0308890 A1 | 12/2008 | Uya | |
| 2009/0085143 A1 | 4/2009 | Park | |
| 2009/0146148 A1 | 6/2009 | Pyo | |

(Continued)

FOREIGN PATENT DOCUMENTS

WO   2010151326 A1   12/2010

*Primary Examiner* — Andres Munoz
(74) *Attorney, Agent, or Firm* — Slater Matsil, LLP

(57) ABSTRACT

Presented herein is a device including an image sensor having a plurality of pixels disposed in a substrate and configured to sense light through a back side of the substrate and an RDL disposed on a front side of the substrate and having a plurality of conductive elements disposed in one or more dielectric layers. A sensor shield is disposed over the back side of the substrate and extending over the image sensor. At least one via contacts the sensor shield and extends from the sensor shield through at least a portion of the RDL and contacts at least one of the plurality of conductive elements.

20 Claims, 17 Drawing Sheets

(56) References Cited

U.S. PATENT DOCUMENTS

| | | |
|---|---|---|
| 2009/0309232 A1 | 12/2009 | Roy |
| 2010/0327391 A1 | 12/2010 | McCarten et al. |
| 2011/0102657 A1 | 5/2011 | Takahashi et al. |
| 2011/0157445 A1 | 6/2011 | Itonaga et al. |
| 2012/0001286 A1 | 1/2012 | Yoon |
| 2012/0086094 A1 | 4/2012 | Watanabe |
| 2012/0098081 A1 | 4/2012 | Horiike et al. |
| 2012/0248580 A1 | 10/2012 | Matsugai et al. |
| 2013/0009270 A1* | 1/2013 | Tsai ............... H01L 27/14623 257/459 |
| 2013/0020468 A1 | 1/2013 | Mitsuhashi et al. |
| 2013/0307103 A1 | 11/2013 | Lin et al. |
| 2014/0061839 A1 | 3/2014 | Ting et al. |
| 2014/0263958 A1* | 9/2014 | Her ............... H01L 27/14685 250/208.1 |
| 2015/0333093 A1 | 11/2015 | Ting et al. |

* cited by examiner

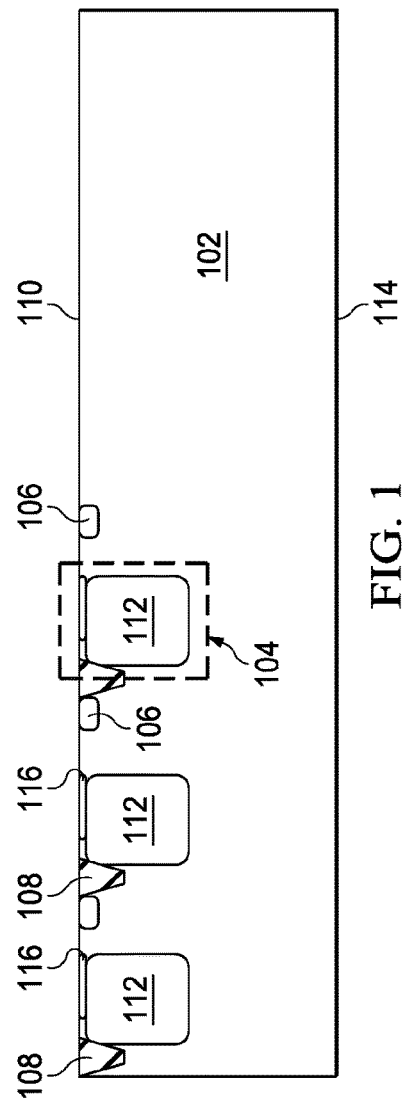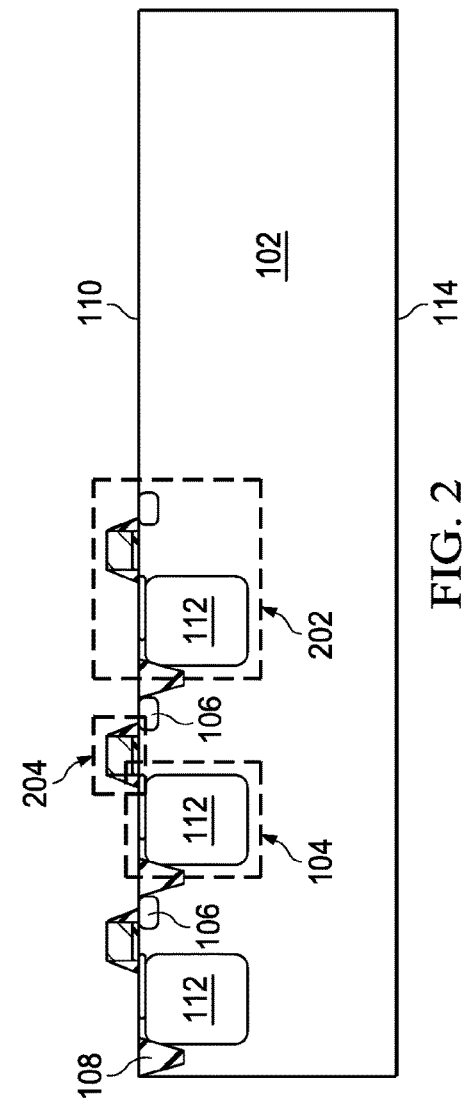

BIASED BACKSIDE ILLUMINATED SENSOR SHIELD STRUCTURE

This application is a divisional application of and claims the benefit of U.S. patent application Ser. No. 14/278,941, filed May 15, 2014, entitled "Biased Backside Illuminated Sensor Shield Structure," which application is incorporated herein in its entirety.

BACKGROUND

A Metal-oxide semiconductor (MOS) image sensor typically comprises an array of picture elements (pixels), which utilizes light-sensitive MOS circuitry to convert photons into electrons. The light-sensitive MOS circuitry typically comprises a photodiode formed in a silicon substrate. As the photodiode is exposed to light, an electrical charge is induced in the photodiode. Each sensor, or pixel, generates electrons proportional to the amount of light that falls on the pixel when light is incident on the pixel from a subject scene. The electrons are converted into a voltage signal in the pixel and further transformed into a digital signal which will be processed by an application specific integrated circuit (ASIC) or other circuitry.

A MOS image sensor, or simply a MOS sensor, may have a front side where a plurality of dielectric layers and interconnect layers are located connecting the photodiode in the substrate to peripheral circuitry, and a backside having the substrate. A MOS sensor is a front-side illuminated (FSI) image sensor if the light is from the front side of the sensor; otherwise it is a back-side illuminated (BSI) sensor with light incident on the backside. For a BSI sensor, light can hit the photodiode through a direct path without the obstructions from the dielectric layers and interconnects located at the front side, which helps to increase the number of photons converted into electrons, and makes the MOS sensor more sensitive to the light source.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-14 are cross-sectional views illustrating intermediate steps of a method of forming an image sensor shield in accordance with some embodiments;

DETAILED DESCRIPTION

Figure 3:
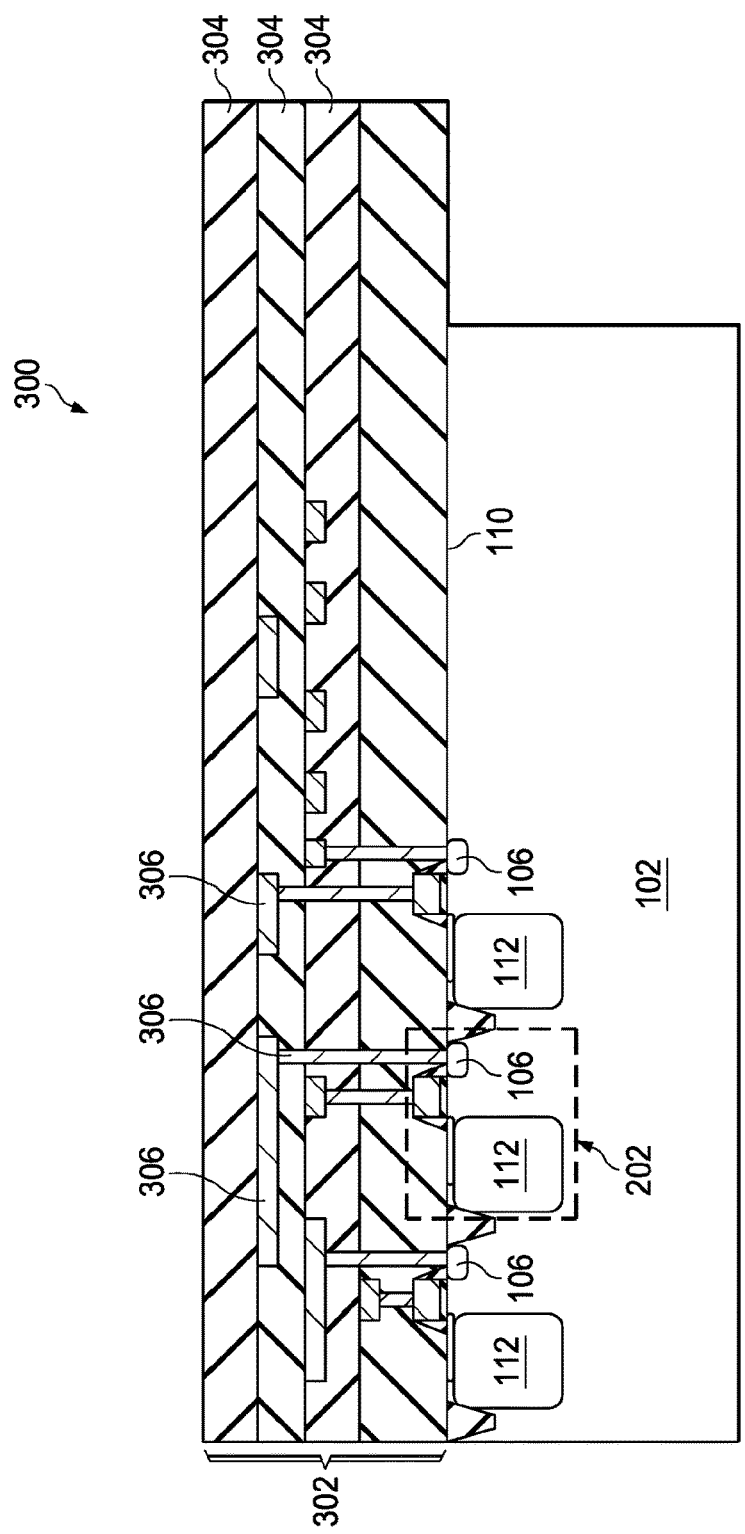

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Damage to silicon substrate during a plasma etch is a phenomenon occurring during formation of image sensor devices. Such plasma damage can cause dark current and white pixel distortion in photodiode operation by altering the structure of the silicon in the photodiode. In photodiodes, silicon damage may cause the photodiode to improperly promote spurious electrons not associated with photoreactivity. Such spurious electrons cause a photodiode to register a light reading, even when no light has caused the promotion of an electron. Thus, silicon damage can cause inaccuracies in a photodiode's sensing of light by inaccurately reflecting the actual amount of light sensed by the photodiode, introducing noise into an image. Dark current is current generated without light, while a white pixel defect is damage to, or overloading of a photodiode by excess dark current, causing the photodiode to always read as if it had sensed a pure white light, when it had not.

It has been discovered that providing a metal sensor shield over the photodiodes, and grounding or biasing the sensor shield, reduces the dark current and white pixel defects by generating a hole accumulation layer at the surface of the semiconductor substrate. It has also been discovered that vias extending through a sensor die substrate can be electrically connected directly to the sensor shield. The vias permit biasing the sensor shield through the sensor or ASIC dies. Presented herein are embodiments of structures, and methods for forming structures, with a through-oxide via electrically connected to an image sensor shield.

FIG. 1 is a cross-sectional-view illustrating formation of photosensitive regions 112 in a substrate 102 according to an embodiment. In some embodiments, the substrate 102 is a semiconductor such as silicon, silicon germanium (SiGe), gallium arsenide (GaAs), or another semiconductor formed as a wafer, die, or the like. One or more photosensitive regions 112, each corresponding to individual image sensor pixels, are formed near the front side 110 of the substrate 102. In some embodiments, the photosensitive region 112 is part of a pinned photodiode, a PN junction diode, a p-type-intrinsic semiconductor-n-type junction (PIN junction) diode, bipolar phototransistor, or the like. A photodiode 104 is, in some embodiments, comprised of a photosensitive region 112 and a surface layer 116 acting as the cathode and anode of a pinned diode.

A floating diffusion drain region 106 is formed near the front side 110 of the substrate, separated from the photodiode 104 to form a source/drain pair for a transistor. Additionally, isolation regions 108 such as shallow trench isolation regions (STIs) are disposed in the substrate 102. The STIs 108 are disposed between each pair of photodiode 104-floating diffusion drain regions 106 to isolate operation of each pixel.

It should be understood that the figures describing the process described herein depict a portion of a die with a limited number of photosensitive regions. However, the region of the die and number of photosensitive regions shown is limited to more clearly depict the process and techniques described herein and should not be construed as limiting. One of ordinary skill in the art will recognize that the substrate 102 can be of any size or configuration, and will have any number of photodiodes, photosensitive regions, active devices or other structures disposed thereon without departing from the spirit of the embodiments.

FIG. 2 is a cross-sectional view illustrating formation of transfer gates 204 for an image sensor device according to an embodiment. The transfer gate 204 spans the floating diffusion drain region 106 and photodiode 104 to form the pixel 202. The photodiode 104 acts as a source for a transistor or pixel 202 and the floating diffusion drain region 106 acts as the drain in a transistor or pixel 202 controlled by the transfer gate 204. The photosensitive region 112 generates electrons in response to light impinging on the photosensitive region 112. The photodiode 104 and the floating diffusion drain region 106 form a transistor with the transfer gate 204 controlling the flow of current from the photodiode 104 to the floating diffusion drain region 106 to indicate sensed light.

FIG. 3 is a cross-sectional view illustrating formation of the sensor die 300 with a redistribution layer (RDL) 302 according to an embodiment. The RDL 302 is formed on the front side 110 of the substrate 102. The RDL 302 comprises one or more dielectric layers 304 with conductive elements 306 such as metal lines and vias disposed in a dielectric material. The conductive elements 306 connect to portions of the pixel 202 to provide electrical connectivity, for example, between two or more pixels 202, or between the pixels 202 and an ASIC, an external connection pad such as a mounting pad, or another device.

In some embodiments, the RDL 302 is formed by depositing a dielectric layer 304, and forming conductive elements 306 in the dielectric layer 304 before forming an overlying dielectric layer 304. The process is repeated to provide the connective between, for example, pixels, control transistors, output ports such as mounting pads, or other target features. In some embodiments, the lowest dielectric layer is an interlayer dielectric (ILD) with vias extending there though to connect underlying structure such as transistor gates or source/drains to overlying structures. In such embodiments, dielectric layers 304 overlying the ILD each have an intermetal dielectric (IMD) portion and an overlying metallization layer. The IMD portion comprises vias extending vertically through the IMD, and the metallization layer comprises conductive lines extending laterally through a dielectric portion of the metallization layer. The conductive lines connect the vias in the underlying IMD with other vias in the same or overlying IMD layers.

The vias and lines are formed in the dielectric layers 304, in some embodiments, using, for example, a dual damascene technique. The dual damascene technique comprises two masking/etching steps, the first masking and etching step comprising masking and etching the routes for the conductive lines followed by masking and etching the via openings. A metal layer is subsequently formed in the etched openings. In this manner, multiple dielectric layers 304 provide multiple IMD layers and multiple metal layers to provide electrical connectivity routed throughout the die.

Figure 4:
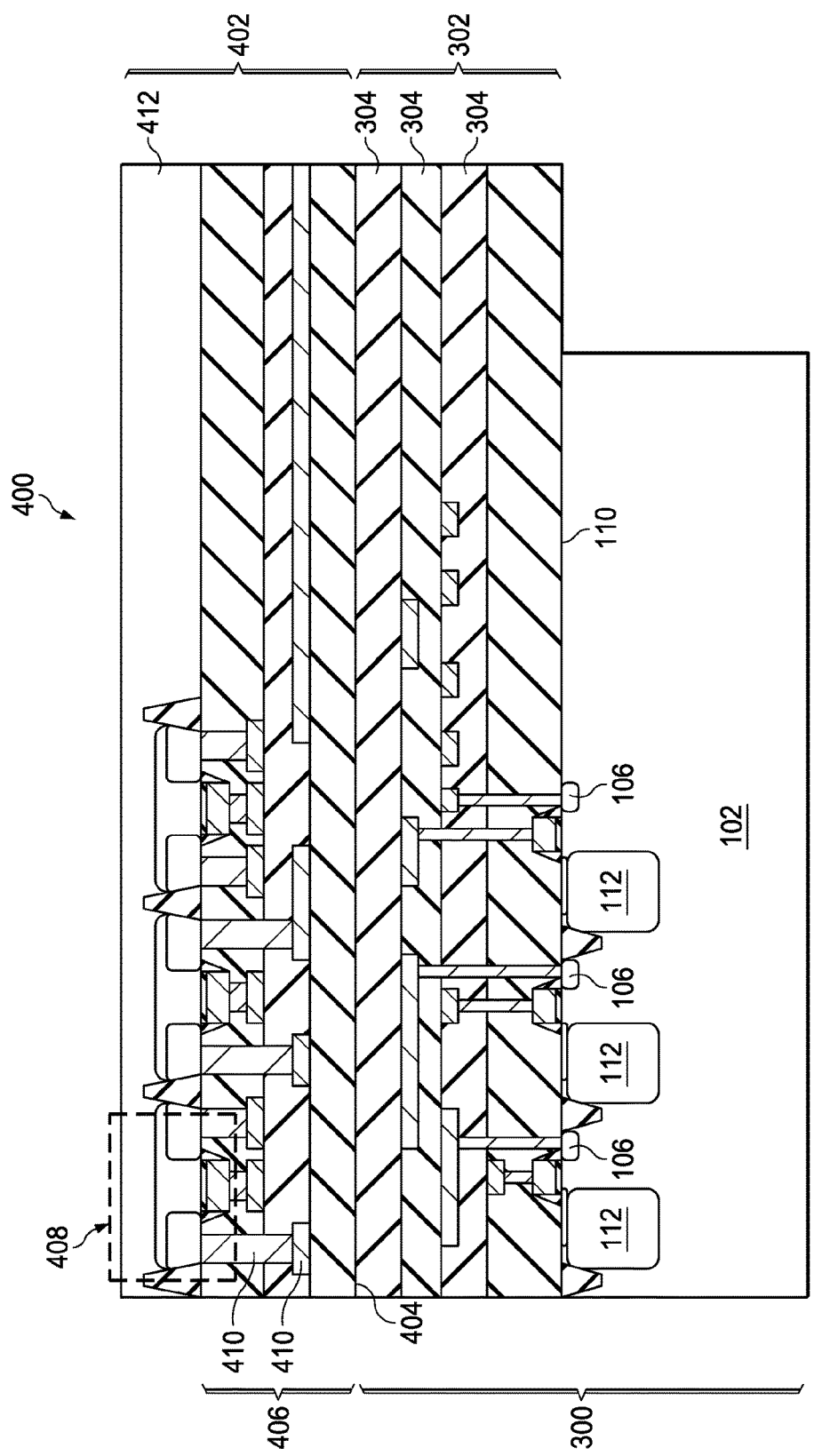

FIG. 4 is a cross-sectional view illustrating formation of the sensor package 400 by bonding a sensor die to an ASIC die 402 according to an embodiment. An ASIC die 402 has one or more control transistors 408 disposed on a substrate 412 and interconnected though conductive elements 410 disposed in an RDL 406. The RDL 406 on the ASIC die 402 is bonded to the RDL 302 of the sensor die 300, creating a bond interface 404. In some embodiments, the RDLs 302 and 406 have corresponding conductive bond pads exposed at the surface of the RDLs 302 and 406. In such embodiments, the bond pads are brought into contact during bonding to provide electrical connectivity between the pixels 202 and the control transistors 408. In other embodiments, the interconnections between devices on the sensor die and the ASIC die are formed after bonding by etching openings through both dies and filling the openings with a conductive via.

In some embodiments, the dies 300 and 402 are bonded through, for example, direct surface bonding, metal to metal bonding, hybrid bonding, or another bonding process. A direct surface bonding process creates an oxide-to-oxide, a semiconductor-to-oxide or a semiconductor-to-semiconductor bond through a cleaning and/or surface activation process followed by applying pressure, heat and/or other bonding process steps to the joined surfaces. In some embodiments, the dies 300 and 402 are bonded by metal-to-metal bonding that is achieved by fusing the surfaces of exposed metal bond pads on each die to each other. In other embodiments, hybrid bonding is used to bond the dies 300 and 402 with a combination of direct bonding and metal to metal bonding, where both the surfaces of the RDLs 302 and 406 and the surfaces of exposed metal bond pads are bonded.

Figure 5:
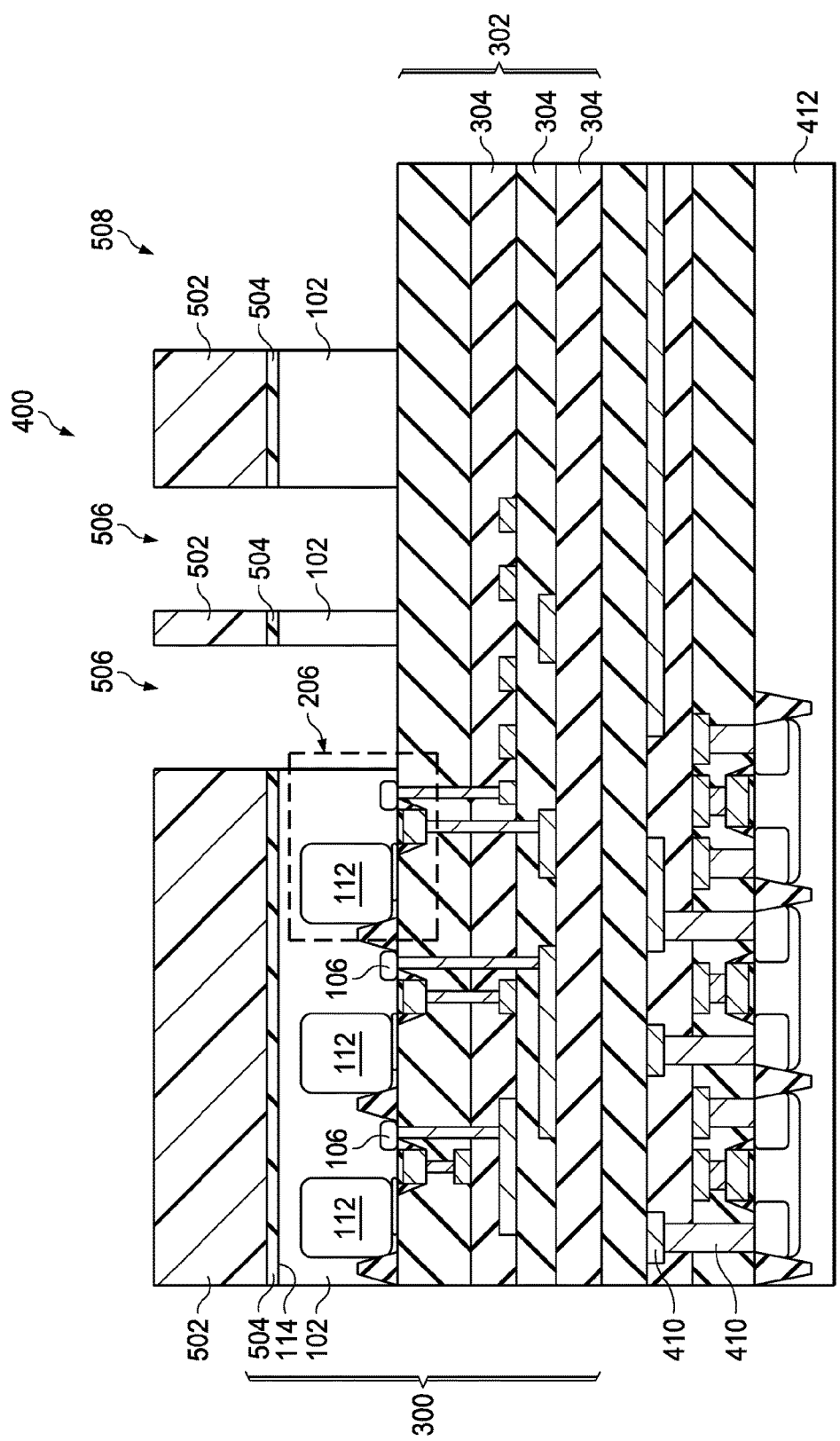

FIG. 5 is a cross-sectional view illustrating patterning of the substrate 102 according to an embodiment. The sensor package 400 is inverted to permit processing of the back side 114 of the sensor die portion of the sensor package 400. The sensor package 400 is mounted to a carrier (not shown) such as a glass carrier or other support structure to facilitate processing. In some embodiments, the back side 114 of the substrate 102 is reduced using a chemical-mechanical polish (CMP) process, a chemical etch process, a mechanical process, or through another process. The substrate 102 is thinned to a point where the pixel 202 structure is maintained, but to where the thickness of the substrate 102 over the photosensitive region 112 is thinned, reducing the amount of non-photosensitive substrate 102 that light must travel through to react with the photosensitive region 112.

A backside anti-reflective coating 504 (BARC) is applied or formed on the back side 114 of the substrate 102. In some embodiments, the BARC 504 is a nitride such as silicon nitride, an oxynitride such as silicon oxynitride, a polymer, a polyimide, or another material, and is formed through chemical vapor deposition (CVD), thermal oxidation, a spin-on process, or another process, and has a thickness between about 200 angstroms and about 6000 angstroms. A mask 502, such a photoresist, is applied over the BARC 504 and patterned using, for example, photolithographic techniques. The mask 502 is used to etch the BARC 504 and the substrate 102 to expose the RDL 302, creating substrate openings 506 and pad openings 508. In some embodiments, the pad openings 508 are disposed in a scribe line between or bordering active portions of dies on a wafer.

Figure 6:
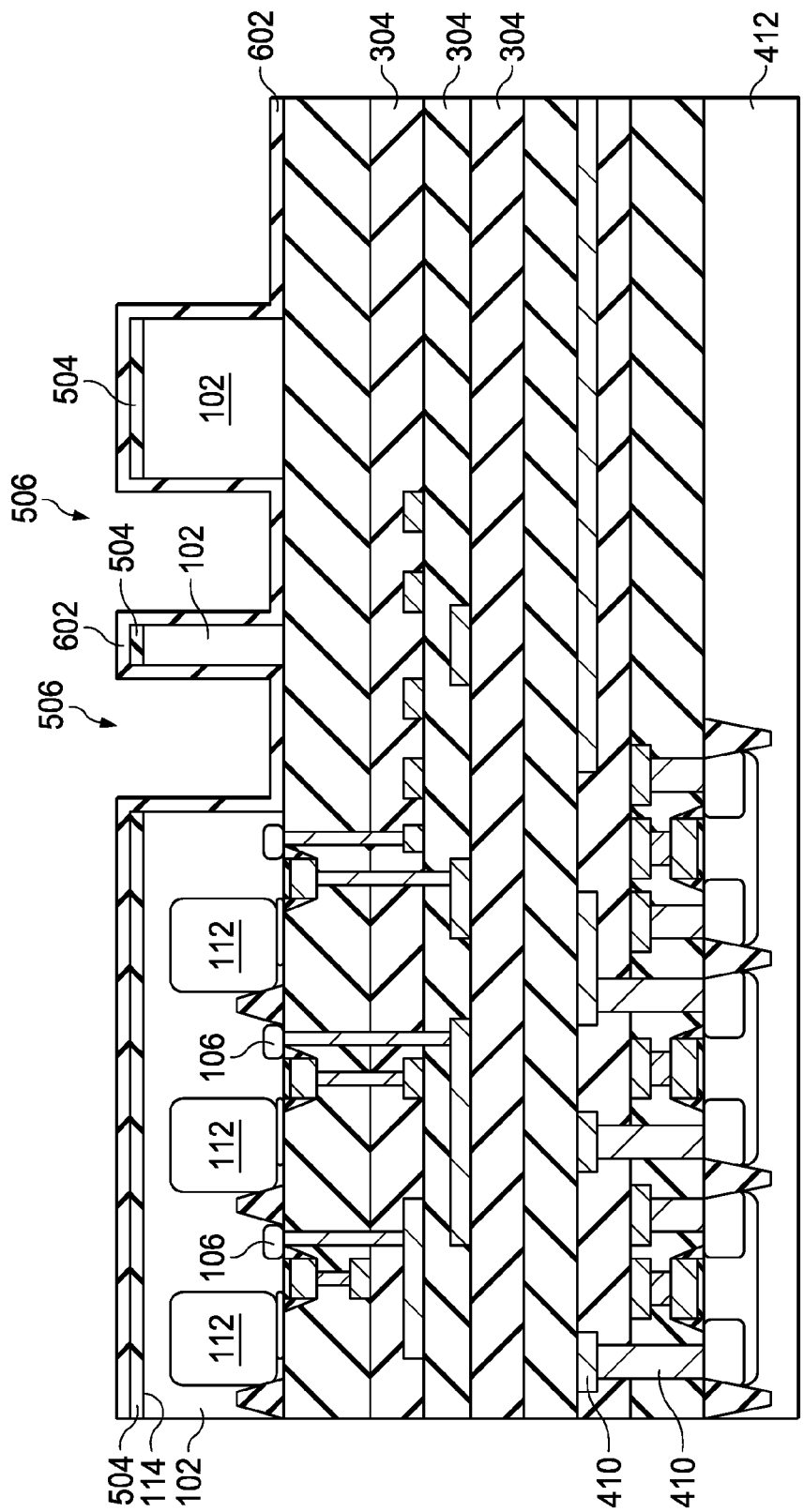

FIG. 6 is a cross-sectional view illustrating formation of an isolation layer 602 according to an embodiment. The isolation layer 602 is, in some embodiments, a conformal oxide such as a silicon oxide or the like deposited by, for example a CVD process such as silane low-pressure chemical vapor deposition (SiH4-LPCVD), tetra-ethyl-ortho-silicate low-pressure chemical vapor deposition (TEOS-LP-CVD), plasma-enhanced chemical vapor deposition (PECVD), or the like. In other embodiments, the isolation layer 602 is formed by thermal oxidation, or another deposition process. The isolation layer 602 is disposed on the sidewalls of the substrate openings 506, and in some embodiments, extends over the sidewalls of the pad openings 508. Additionally, the isolation layer 602 extends over the top surface of the BARC 504 and has portions aligned over the pixels 202. It has been discovered that forming the isolation layer having a thickness on the sidewalls of the substrate openings 506 between about 200 angstroms and about 8000 angstroms provides electrical insulation between the substrate 102 and a via (See, e.g., 902 of FIG. 9) without unduly narrowing the substrate opening 506.

Figure 7:
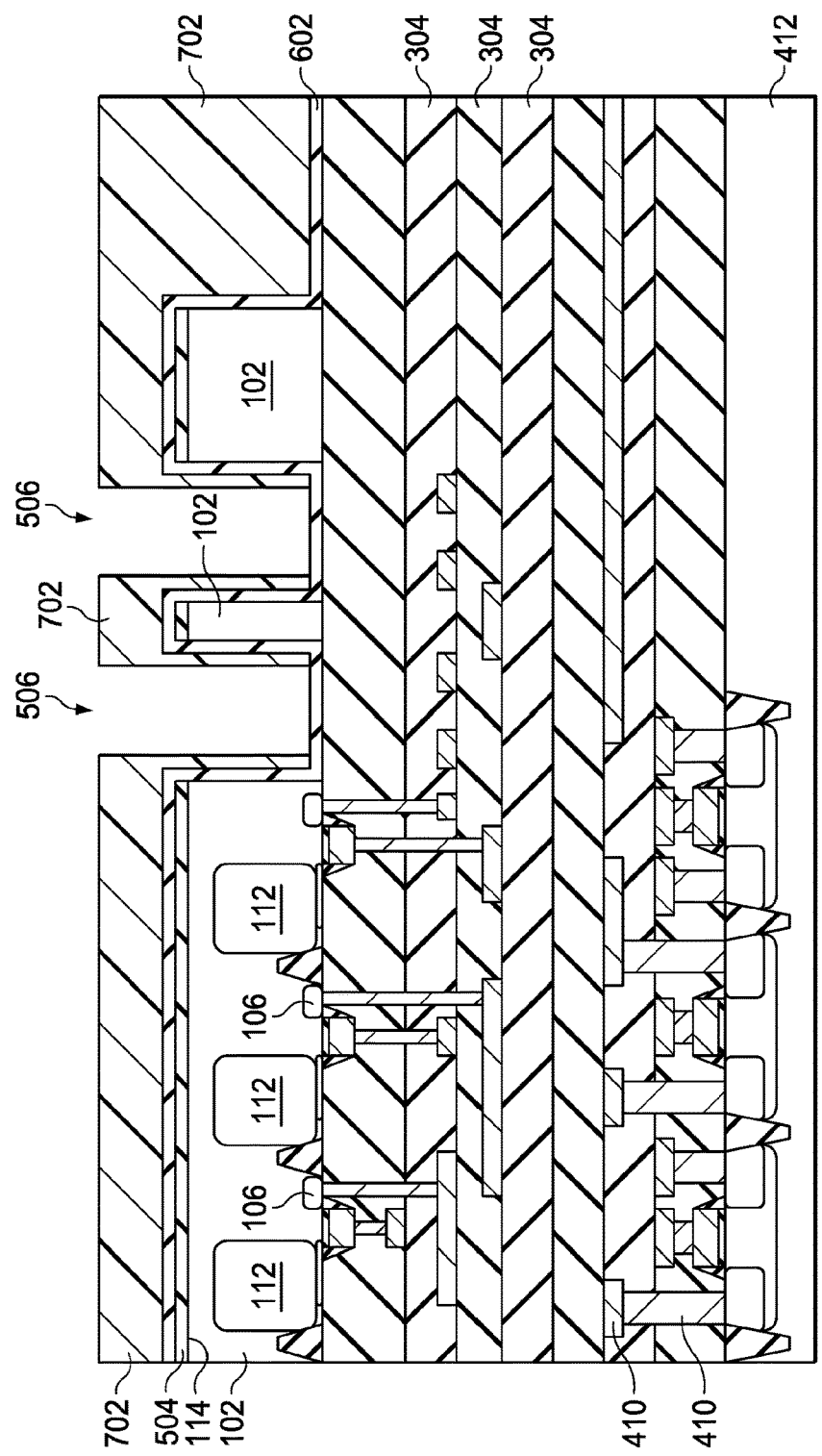

FIG. 7 is a cross-sectional view illustrating formation of a second mask 702 according to some embodiments. The second mask 702 is formed from, for example, a photoresist, a hard mask or another mask material. The second mask 702 is patterned to create openings over the substrate openings 506. In some embodiments, the openings in the second mask 702 are narrower than the substrate openings 506 in the substrate 102, with a portion of the second mask 702 extending into the substrate openings 506.

Figure 8:
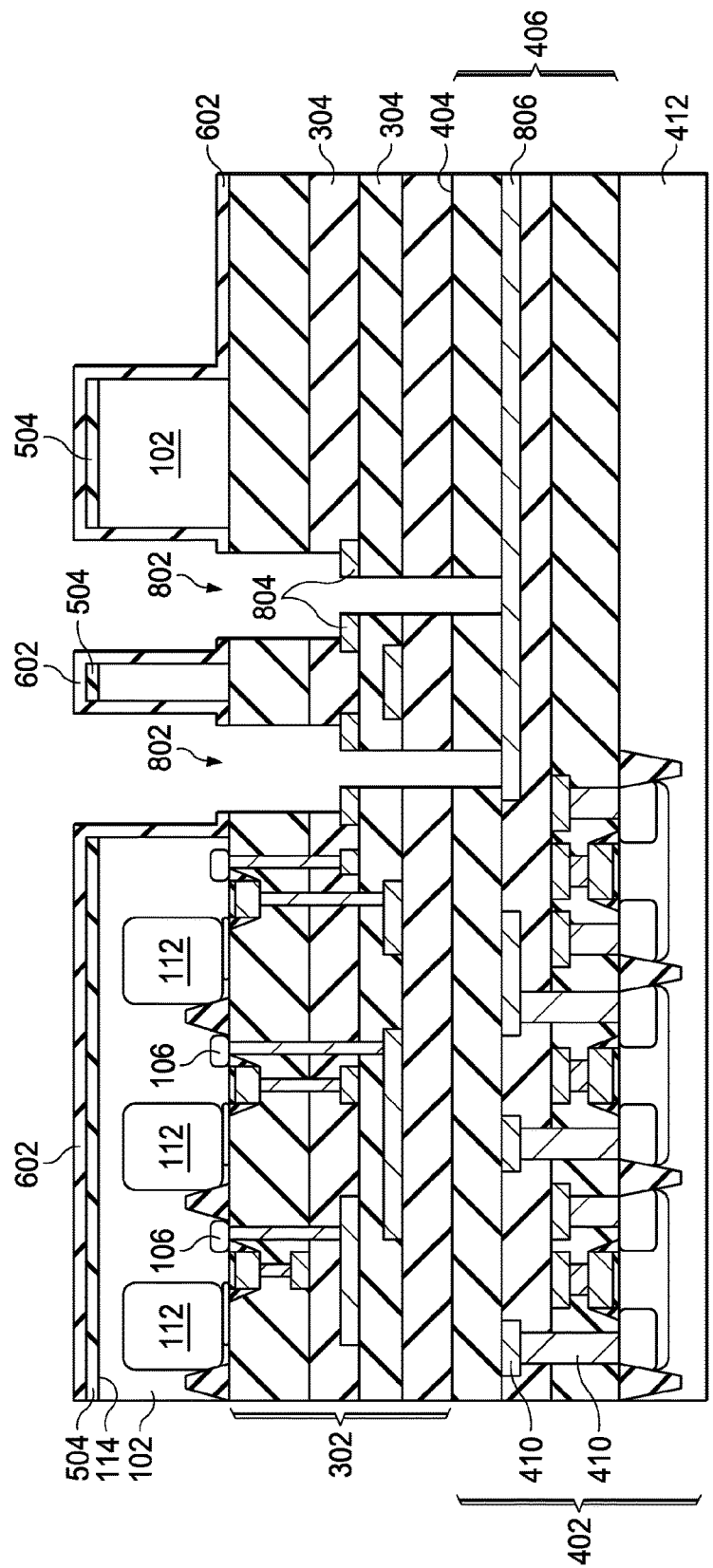

FIG. 8 illustrates etching via openings 802 through the RDLs 302 and 406 according to an embodiment. The via openings 802 extend from the top surface of the isolation layer 602 into the RDLs 302 and 406. In some embodiments, the via openings expose a conductive element such as a pad or land 806 in the RDL 406 of the ASIC die 402. Additionally, the second mask 702 having openings that are narrower than the substrate openings 506 forms shoulders, or ledges in the bottom surface of the substrate openings 506, where a portion of the isolation layer 602 extends laterally over the topmost surface of the RDL 302 in the via opening 802. In some embodiments, conductive elements in the RDLs 302 and 406 are arranged to form mask pads 804 that acts as a hard mask during etching of the via openings 802. The mask pads 804 cause the lower portion of the via opening 802 to be narrower than the middle portion, since openings in the mask pads 804 are narrower than the openings in the second mask 702 that define the size of the middle portion of the via opening 802. Thus, the mask pads 804 have a top portion exposed in the via openings 802. The use of the conductive elements 306 and 410 in the RDL 302 and 406 as mask pads 804 permits etching of via openings 802 with different widths or sizes in the RDL 302 and 406 with a single masking/etching process step.

Figure 9:
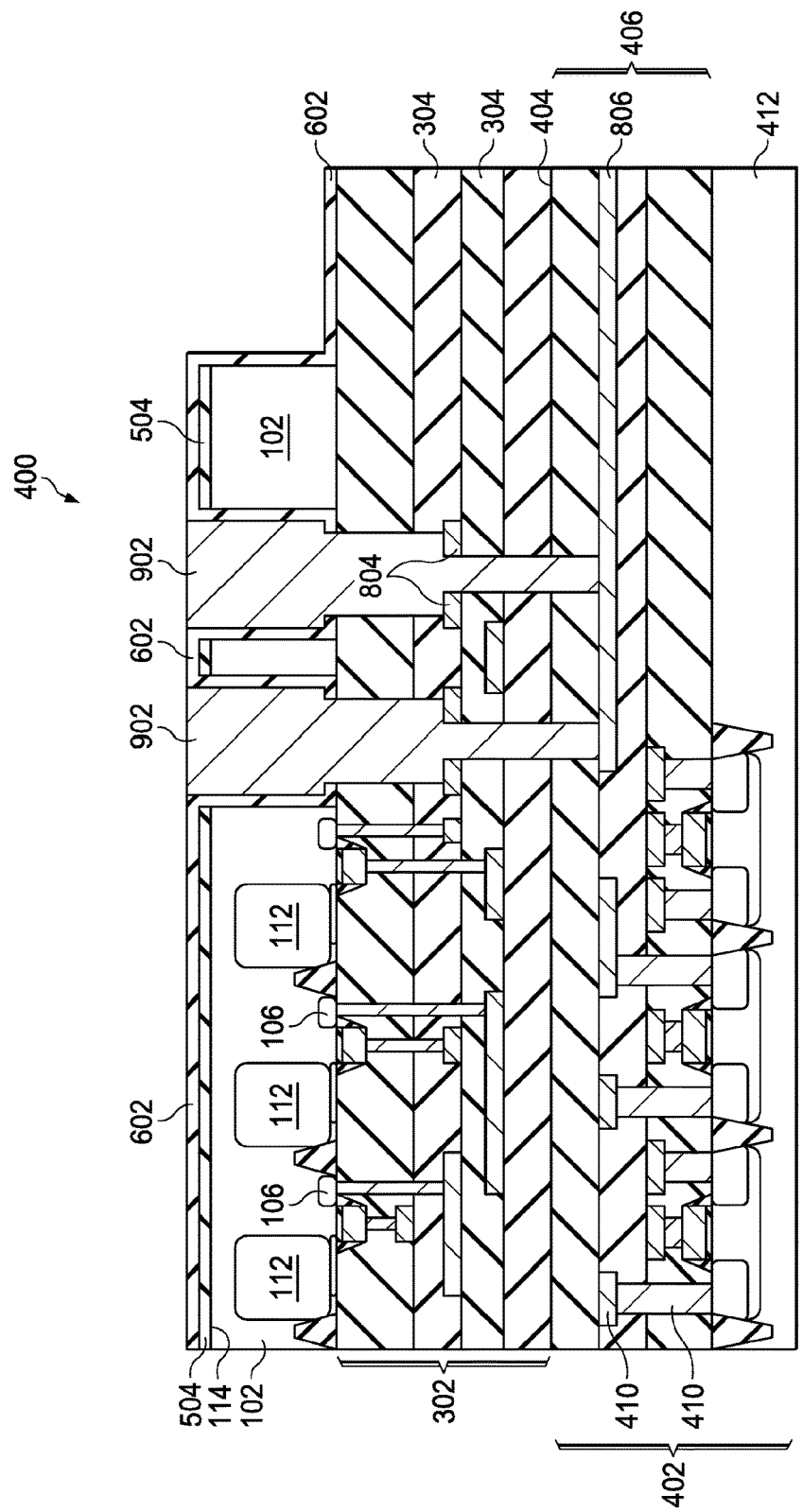

FIG. 9 is a cross-sectional view illustrating formation of vias 902 according to an embodiment. In some embodiments, the vias 902 are formed by depositing a barrier layer (not shown for clarity), formed from, for example, a metal such as tantalum (Ta), titanium (Ti), or the like, from a nitride such as tantalum nitride (TaN), titanium nitride (TiN), or the like, or from another barrier material. The barrier layer is formed on the surface of the via openings 802 and extends onto the surface of the isolation layer 602 in the via openings 802. The barrier layer prevents migration of material in the vias 902 from migrating into the substrate 102 or RDLs 302 and 406, and the isolation layer 602 acts as an electrical insulator separating the via 902 from the substrate 102.

In some embodiments, the vias 902 are formed by electrochemical plating (ECP), electroplating, electroless plating or another deposition process and are formed from copper (Cu), aluminum-copper alloy (AlCu), palladium, (Pa), tungsten (W), gold (Au), titanium (Ti), tantalum (Ta), another metal, another alloy or another conductive material. In some embodiments where a plating process is used to form the vias 902, a seed layer (not shown for clarity) is formed over the barrier layer using atomic layer deposition, CVD, or another conformal deposition process. The seed layer provides nucleation sites for material deposited by the plating process, resulting in more uniform and void-free vias 902 than without a seed layer. Thus, the vias 902 as illustrated comprise, in some embodiments, barrier layers, seed layers, liner layers or other processing coatings or layers.

The vias 902 are planarized so that the top surfaces of the vias 902 are about level with, and substantially planar with, the top surface of the isolation layer 602. The planarization, in some embodiments, is performed using a CMP, etching or grinding process. The vias 902 extend from the top surface of the isolation layer 602 through the substrate 102 into the RDL 302 to contact at least one conductive element in the RDL 302. In some embodiments, the vias 902 contact the mask pads 804 and extend through openings in the mask pads 804 to contact the land 806 in the RDL 406 on the ASIC die 402. The vias 902 contact the top surface of the land 806, and contact the top and interior surfaces of the mask pads 804, proving electrical connectivity between features disposed in the sensor package 400 and exterior features.

Figure 10:
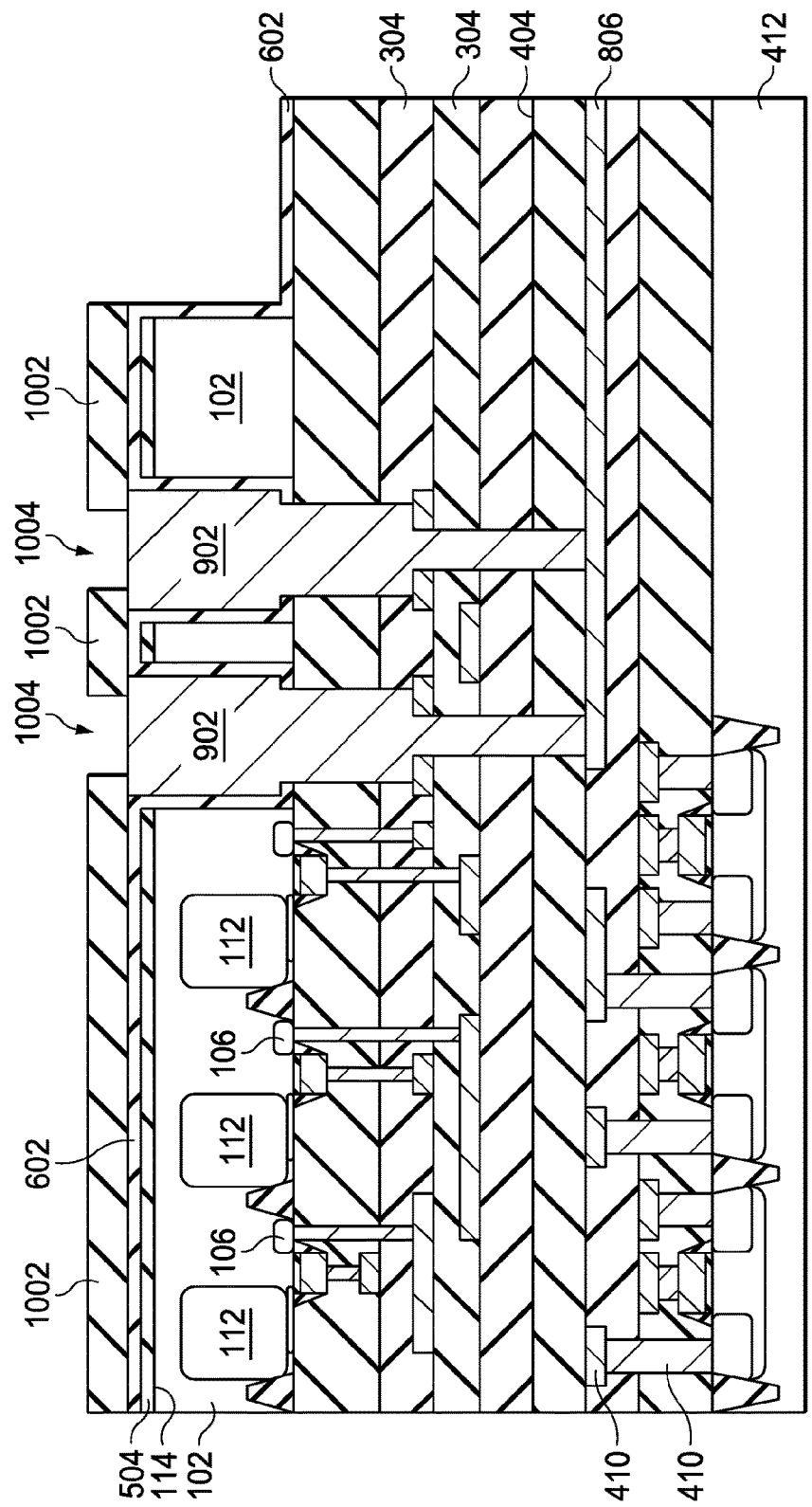

FIG. 10 is a cross sectional view illustrating formation of a cap layer 1002 according to an embodiment. The cap layer 1002 is formed over the isolation layer 602 from a dielectric material such as an oxide, nitride, oxynitride, polyimide, polymer or the like. In some embodiments, the cap layer 1002 is a plasma enhanced silicon nitride (PESN) deposited with, for example, a PECVD process, and to a thickness between about 200 angstroms and about 6000 angstroms. The cap layer 1002 is patterned and etched, for example, using a third mask patterned and developed with photolithography, using a hard mask, or another masking and etching technique. The cap layer 1002 extends over the pixels 202 and has cap layer openings 1004 disposed over and exposing the top surface of the vias 902.

Figure 11:
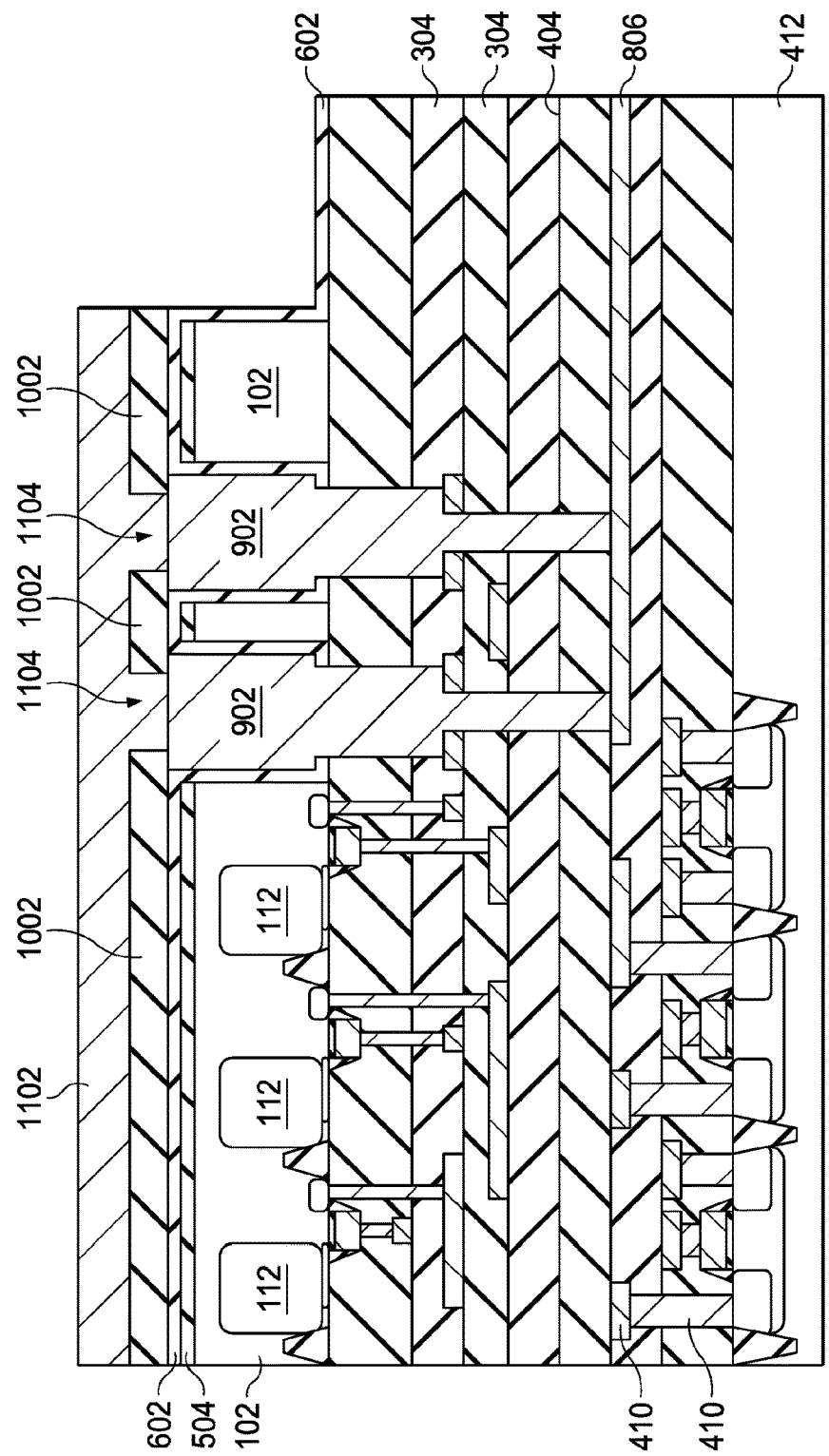

FIG. 11 is a cross-sectional view illustrating formation of a grid layer 1102 according to an embodiment. In some embodiments, the grid layer 1102 formed from a metal such as aluminum, copper, titanium, an oxide, a polymer, or another reflective and/or opaque material. A metal grid layer 1102 is formed over the cap layer 1002 using a plating process, using CVD or PECVD, using sputtering, or using another deposition process. The grid layer 1102 has connector portions 1104 that extend into the cap layer openings 1004.

In some embodiments, a seed layer, barrier layer, adhesion layer, liner layer or other processing layers are formed prior to deposition of the grid layer 1102. Thus, the grid layer 1102 depicted comprises, in some embodiments, one or more processing layers formed on the cap layer 1002 and a bulk conductive material disposed over the processing layers.

Figure 12:
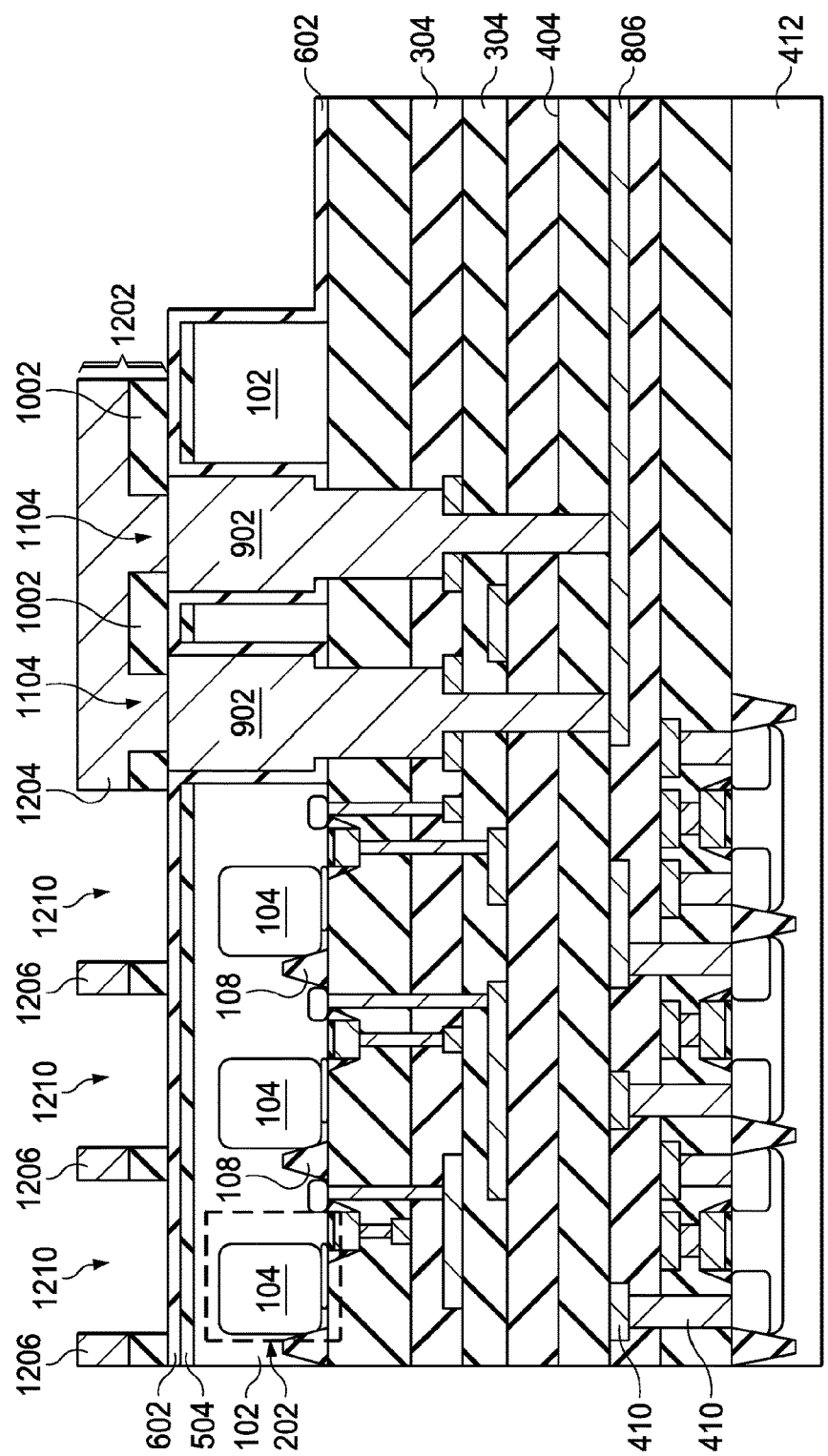

FIG. 12 is a cross-sectional view illustrating etching of the grid layer 1102 to form a sensor shield 1202 with a grid 1206 and boundary shield 1204. The grid layer 1102 is masked with, for example, a patterned hard mask, photoresist, or the like, and etched to create pixel openings 1210 over each pixel 202. A boundary shield 1204 surrounds the array of pixels 202 and connects to each element of the grid 1206 to form the sensor shield 1202. In some embodiments, the isolation layer 602 is etched to form the pixel openings 1210 in a same process step as etching the sensor shield 1202.

The grid 1206 comprises individual grid elements separating each pixel to assist in columnating incoming light. The grid 1206 prevents light entering the substrate 102 at an angle from interacting with a pixel 202 adjacent to the region where the light enters. A reflective sensor shield 1202 material reflects angled light into the pixel 202 directly below the corresponding pixel opening 1201. Additionally, while the individual grid elements are shown disposed over the STIs 108 between the pixels 202, the grid 1206 elements, in some embodiments, extend over portions of the pixel 202 to, for example, prevent interference in the channel or drain of the pixel, or generation of electrons in the substrate 102 outside of the photodiodes 104.

It has been discovered that connecting the sensor shield 1202 to a source of ground or reverse bias voltage provides a surface hole accumulation layer at the surface of the substrate 102, which absorbs spurious surface electrons caused by substrate lattice damage, voids, dislocation, crystal defects or other imperfections. The spurious surface electrons could result in dark current and white pixel noise due to electrons generated outside of the photodiodes 104 entering the photodiode 104. Thus, the vias 902 connect the sensor shield 1202 to one or more lands 806 or other conductive elements 306 in the RDLs, which are in turn connected to a mounting pad (See, e.g., element 1402, FIG. 14), control transistor on the ASIC die 402, or another source of a biasing voltage.

It has further been discovered that connecting the sensor shield 1202 to a via 902 that extends thought the RDLs 302 and 406 provides the ability to connect the sensor shield 1202 to one or more conductive elements 306 that may be disposed in one or both of the RDLs 302 and 406 on the sensor die and ASIC die 402. In some embodiments, the sensor shield 1202 is a single electrically connected structure that is biased to a single voltage. In other embodiments, the sensor shield 1202 is comprised of multiple electrically isolated portions where each shield portion is biased to a different voltage at the same time. For example, the grid 1206 may be electrically isolated from a portion of the boundary shield 1204, with the grid 1206 negatively biased with respect to the substrate 102, and the boundary shield 1204 grounded.

While the Figs. illustrate two vias 902 connecting to the sensor shield 1202, it should be understood that such an arrangement is exemplary and for illustrative purposes, and should not be considered to be limiting. Different via 902 connection arrangements may be used. For example, it has been discovered that pairs of vias 902 connected to the sensor shield 1202 in a particular region provide improved reliability over single vias 902 due to the lower chance of a suboptimal connection between the vias 902 and sensor shield caused by process variation. Additionally, in some embodiments, multiple pairs of vias 902 distributed around, for example, the border of the sensor shield 1202, provide a more even voltage or bias distribution than a single connection point.

Figure 13:
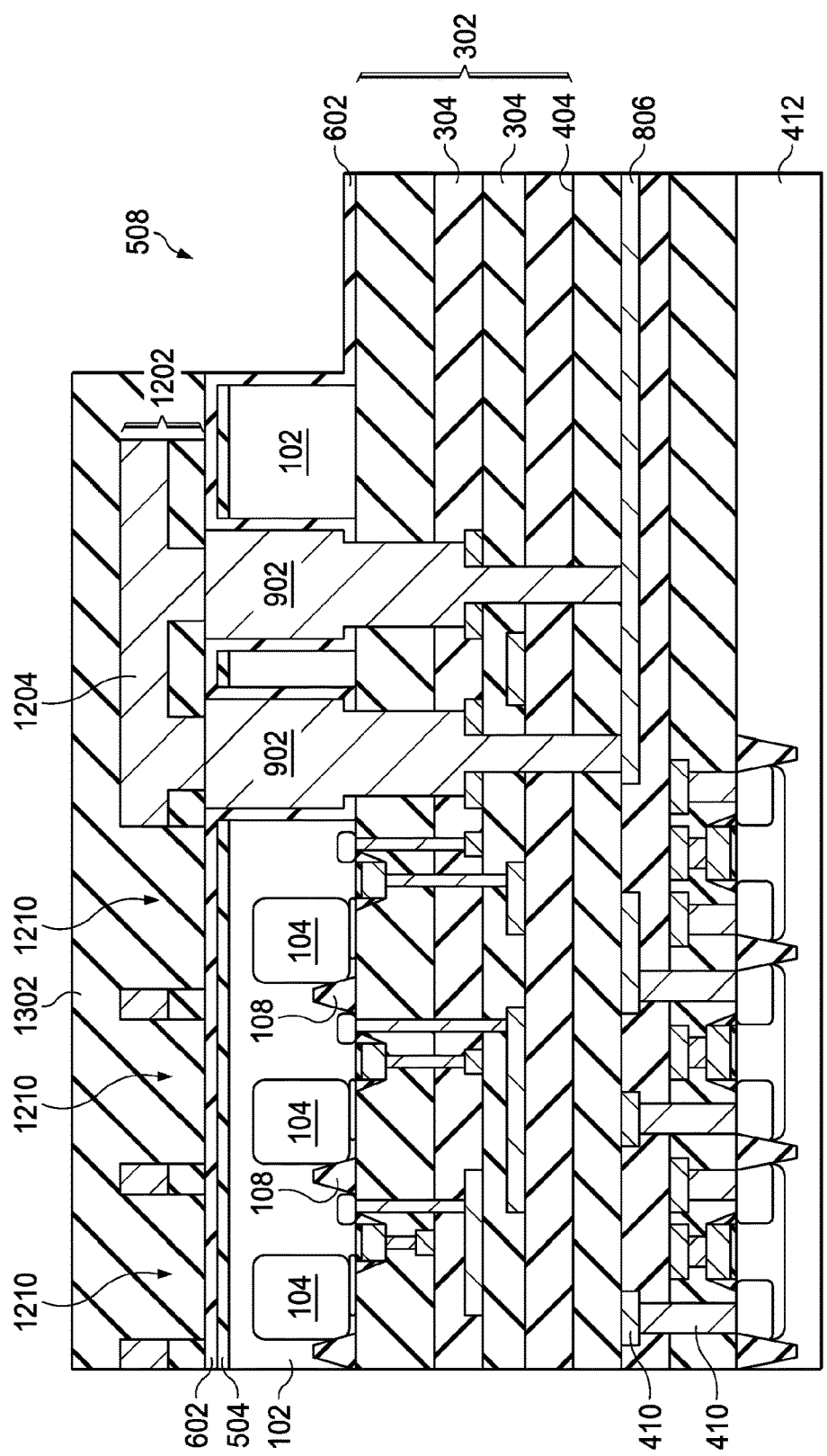

FIG. 13 is a cross sectional view illustrating formation of an oxide fill layer 1302 according to an embodiment. The oxide fill layer 1302 is disposed over the sensor shield 1202 and fills the pixel openings 1210 in the sensor shield 1202. In some embodiments, the oxide fill layer 1302 extends into the pad opening 508 after formation, and is subsequently etched or otherwise removed to provide access to the portion of the isolation layer 602 disposed on the RDL 302.

Figure 14:
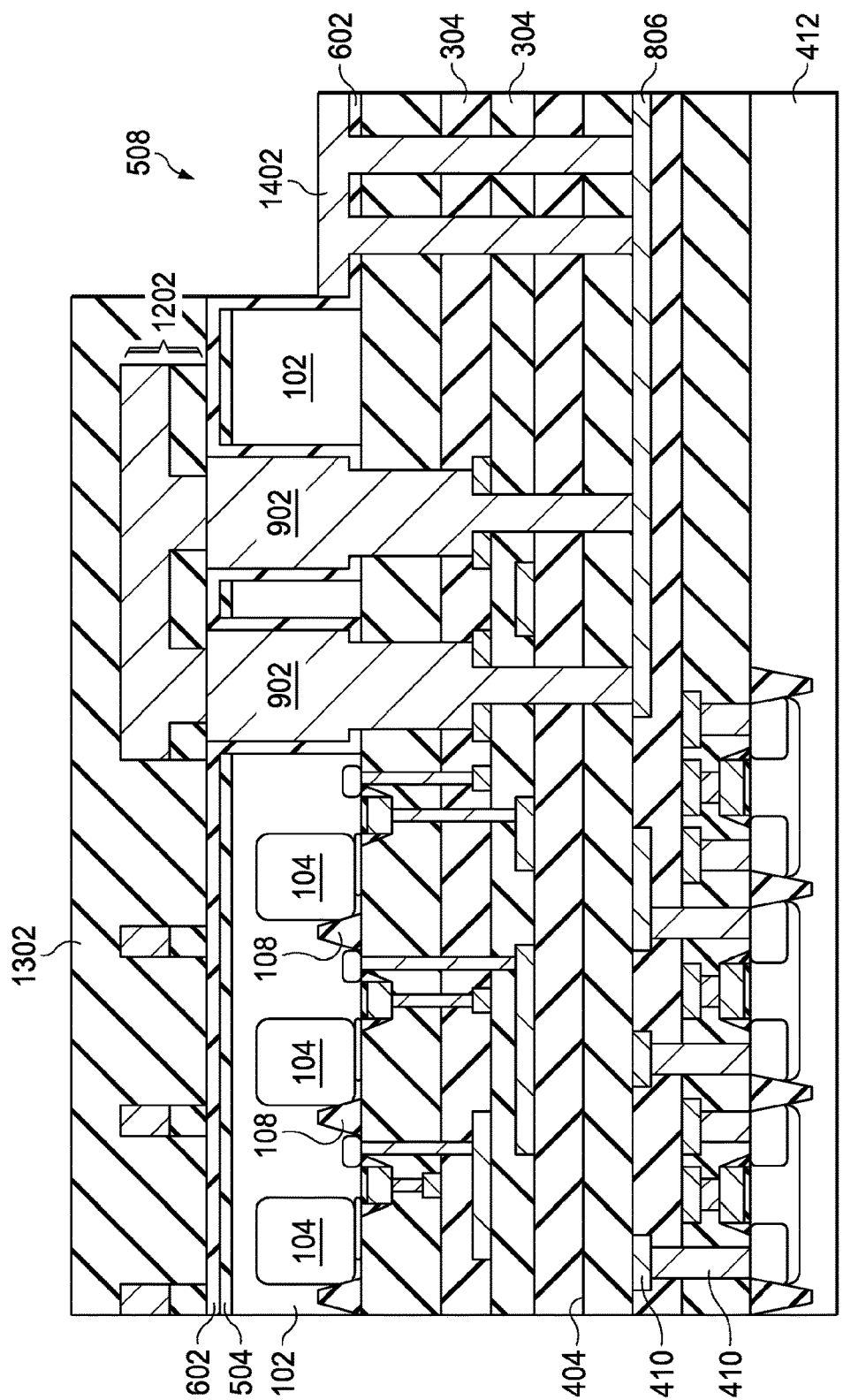

FIG. 14 is a cross sectional view illustrating formation of mounting pads 1402 according to an embodiment. Openings exposing one or more lands 806 are etched in the RDLs 302 and 406. The mounting pads 1402 are then formed over and extending through the openings to contact the lands 806. In some embodiments, the mounting pads 1402 are formed by electroplating, electrochemical plating, electroless deposition, or another deposition method. Additionally, in some embodiments, the mounting pads 1402 are formed form aluminum-copper alloy, copper, aluminum, tungsten, palladium or another conductive material. It has been discovered that a mounting pad 1402 with more than one via extending through the RDLs 302 and 406 to the lands 806 increases the reliability of the connection between the mounting pad 1402 and the lands 806.

In some embodiments, the mounting pads 1402 are formed with a top portion on the RDL 302, and without passing through the substrate 102. The mounting pads 1402 are formed in, for example, a dicing street outside of the active area of the sensor package 400.

Figure 15:
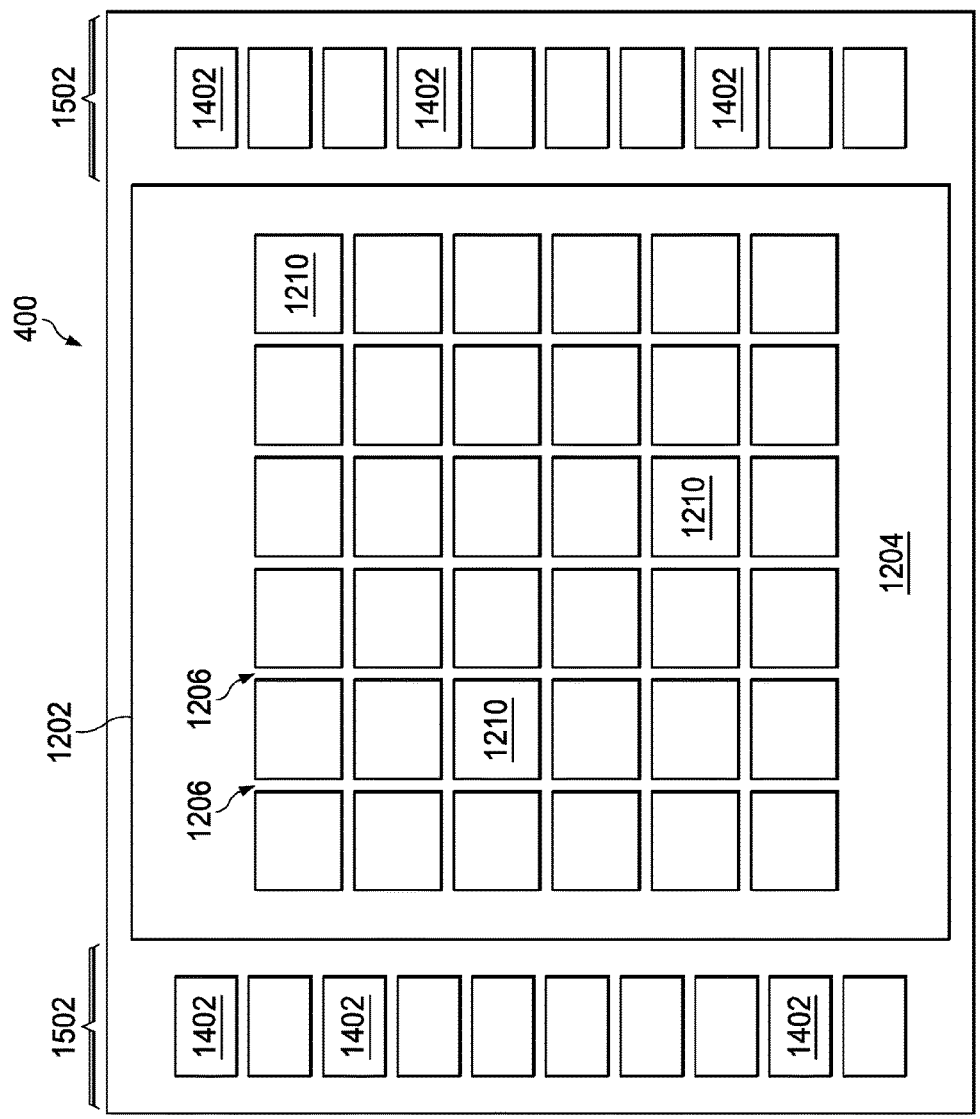
FIG. 15 is a top view illustrating an image sensor package with an sensor shield in accordance with some embodiments.

FIG. 15 is a top view illustrating an image sensor package 400 with a sensor shield 1202 in accordance with some embodiments. The mounting pads 1402 are disposed in a dicing street 1502 outside of the substrate region. The sensor shield 1202 has a grid 1206 defining pixel openings 1210 disposed over each pixel. The boundary shield 1204 borders the grid 1206.

Figure 16A:
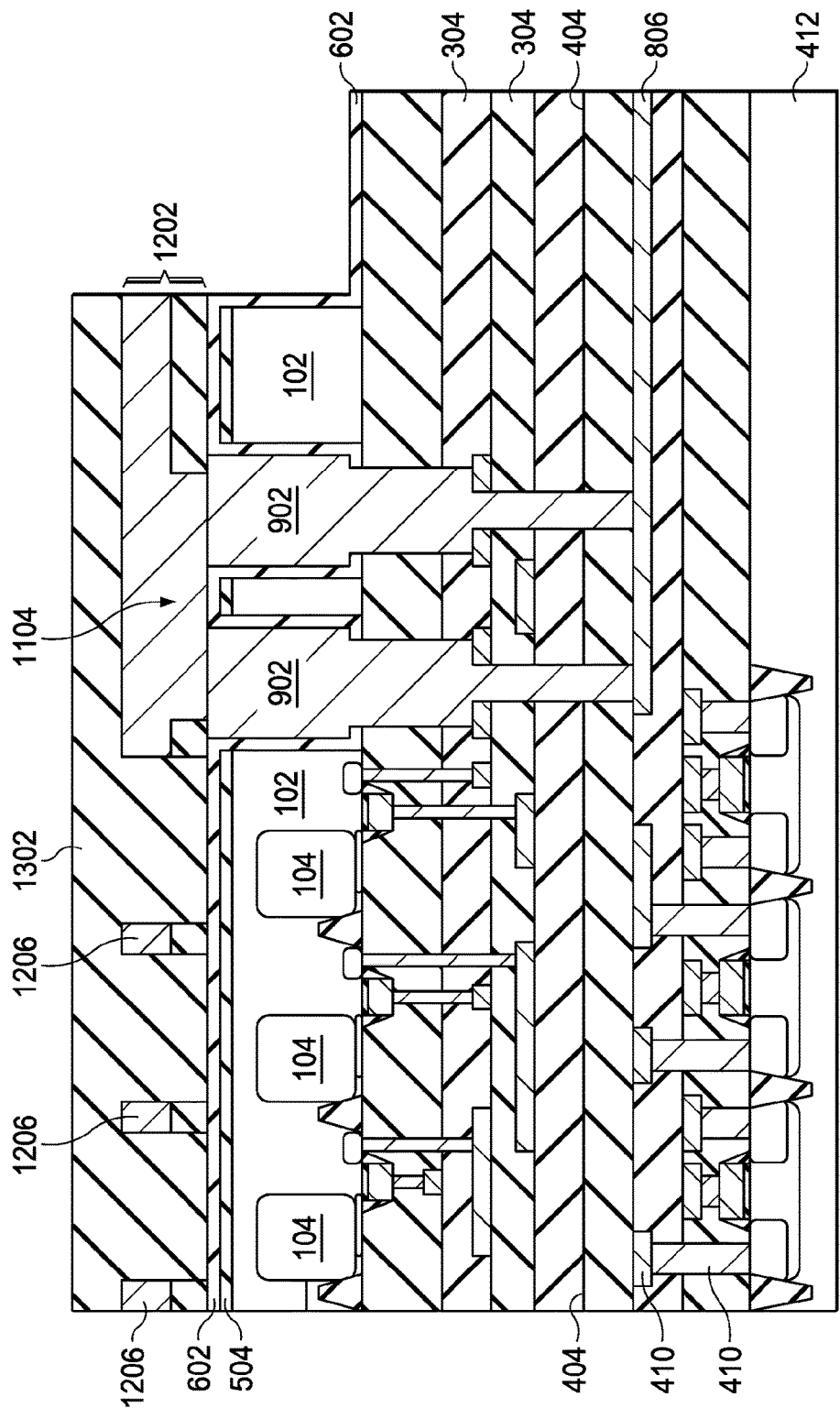
FIGS. 16A and 16B are cross-sectional views illustrating embodiments of image sensor shields arrangements.

FIG. 16A is a cross-sectional view illustrating a sensor shield 1202 with a single connector portion according to an embodiment. In such an embodiment, a single connector portion 1104 for the sensor shield 1202 extends though the isolation layer 602 to contact multiple vias 902.

Figure 16B:
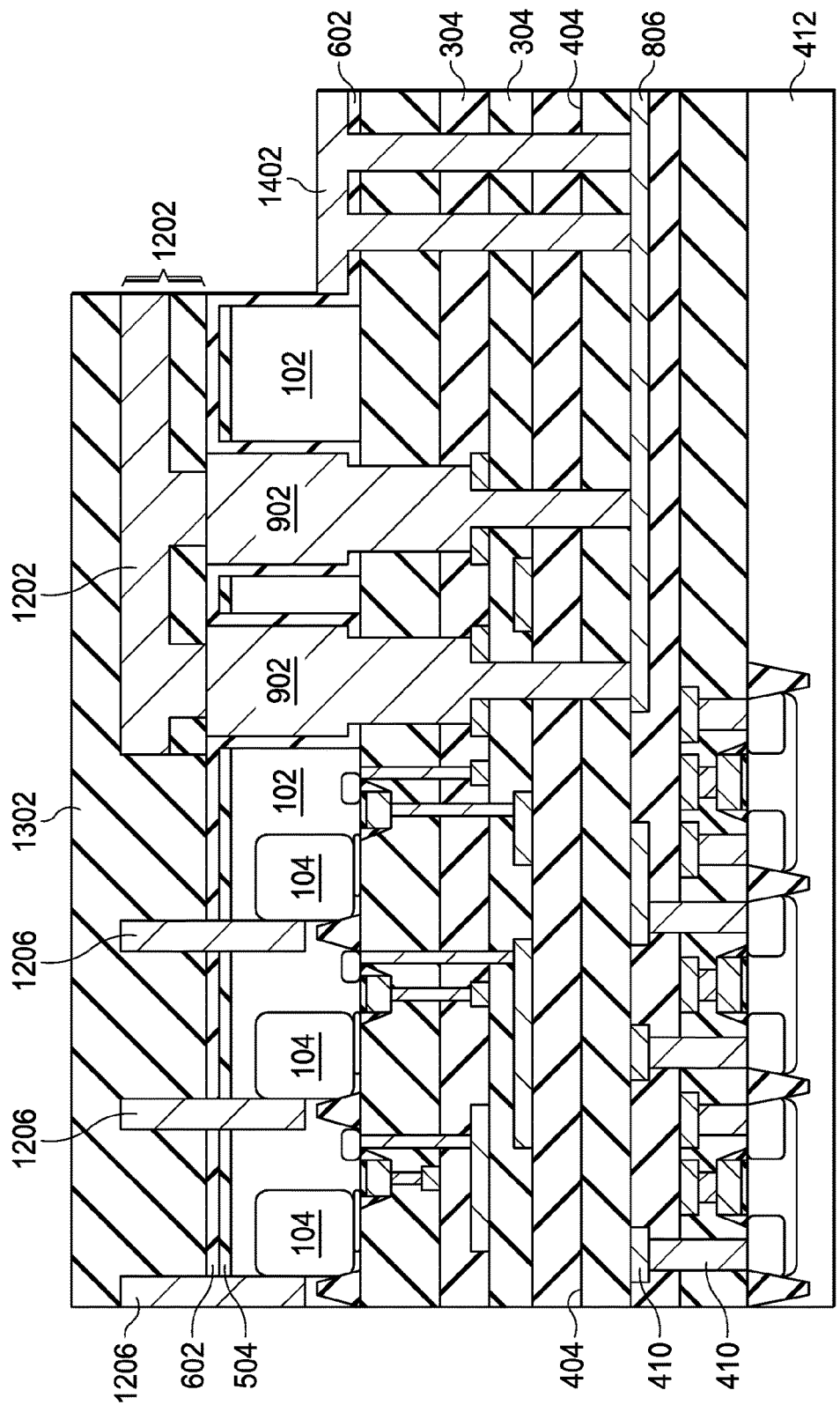

FIG. 16B is a cross-sectional view illustrating a sensor shield with deep grid 1206 elements. In such an embodiment, the grid elements extend through a portion of the substrate and provide increased optional isolation of each pixel 202. In some embodiments, the grid 1206 elements extend to the STIs 108. The openings for the deep grid 1206 elements are formed, in some embodiments, during the etching of the via openings, and subsequently filled during the formation of the grid layer.

Figure 17:
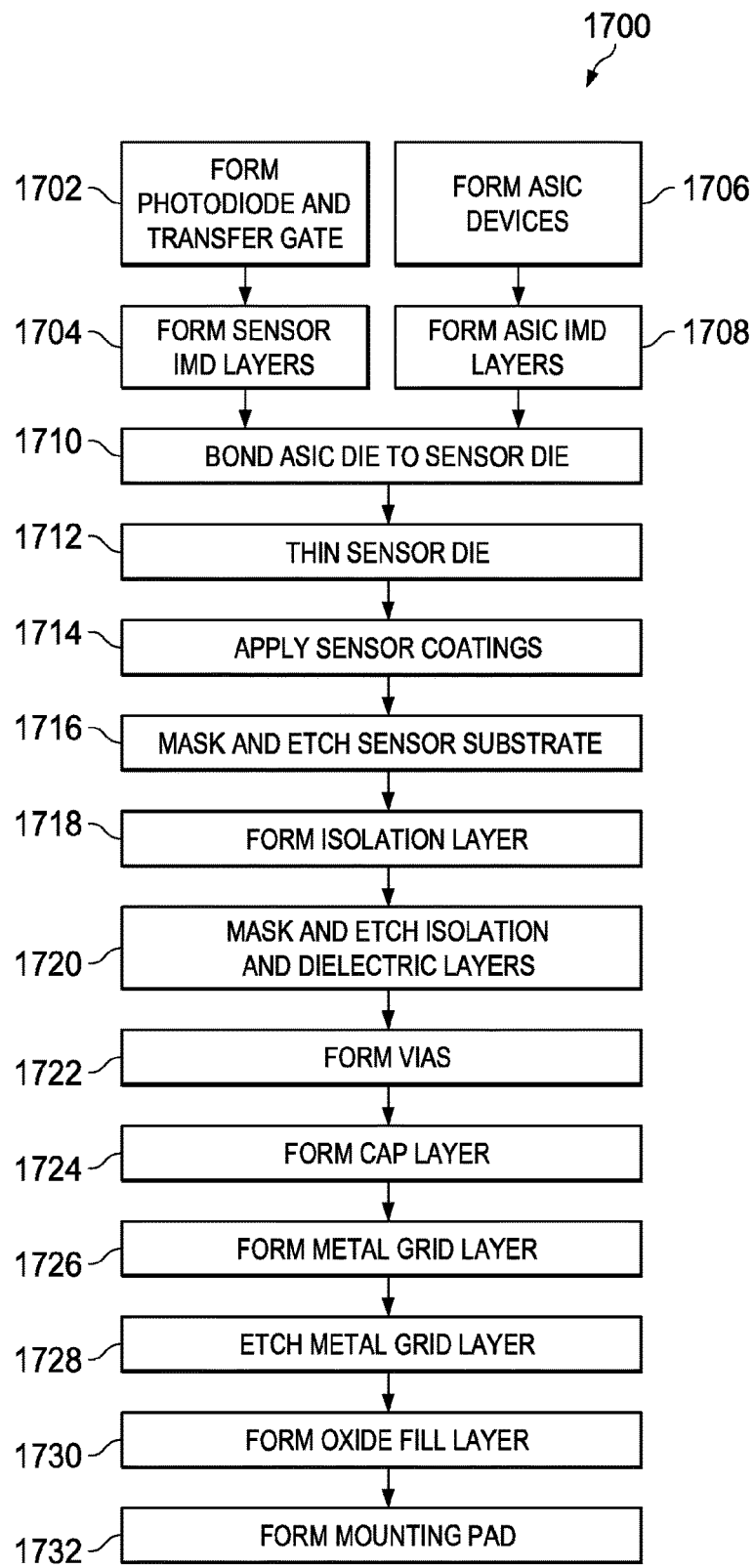
FIG. 17 is a flow diagram illustrating a method of forming an image sensor shield in according with some embodiments.

FIG. 17 is a flow diagram illustrating a method 1700 for forming a biased sensor shield according to some embodiments. In block 1702, photodiodes and transfer gates are formed in the substrate, resulting in an array of pixels. Sensor IMD layers are formed in block 1704, and conductive elements, including mask pads or lands where included, are disposed therein. ASIC devices, such as control transistors and the like are formed on the ASIC substrate in block 1706. ASIC IMD layers are formed in block 1708 over the ASIC devices, and comprise conductive elements, including lands where included. The ASIC die and sensor die are bonded in block 1710, and the backside of the sensor die substrate is thinned in block 1712. Sensor coatings, such as a BARC, are applied over the back side of the sensor die in block 1714. The sensor substrate is masked and etched to create substrate openings in block 1716, and an isolation layer is formed over the coating layers, and extending into the substrate openings, in block 1718. The insulation layer and the and dielectric layers of the RDLs are masked and etched in block 1720, forming the via openings and exposing the lands and/or mask pads. The vias are formed in the via openings in block 1722 and subsequently planarized. The cap layer is formed and patterned in block 1724. The metal grid layer is formed in block 1726, with the metal grid layer disposed over the cap layer and extending through openings in the cap layer to contact the vias. The metal grid layer is etched in block 1728, creating the grid with defined pixel openings and border shield that comprise the sensor shield. The oxide fill layer is formed over the sensor shield in block 1730, and the mounting pads are formed in block 1732. Additional processing steps, such as packaging, coating, color layer, lens mounting or other processing steps are, in some embodiments, subsequently performed.

Thus, according to an embodiment, a device comprises an image sensor having a plurality of pixels disposed in a substrate and configured to sense light through a back side of the substrate and an RDL disposed on a front side of the substrate and having a plurality of conductive elements disposed in one or more dielectric layers. A sensor shield is disposed over the back side of the substrate and extending over the image sensor. At least one via contacts the sensor shield and extends from the sensor shield through at least a portion of the RDL and contacts at least one of the plurality of conductive elements. The at least one via is configured to transmit a voltage signal from the at least one first conductive element to the sensor shield. In some embodiments, the device further comprises a mounting pad configured to receive a voltage signal and conduct the voltage signal to the sensor shield through the via to bias the sensor shield. The at least one via extends through an opening in the substrate. A cap layer is disposed on the back side of the substrate, with the sensor shield disposed on the cap layer. The cap layer has at least one opening over the at least one via, with a connector portion of the sensor shield extending through the opening and contacting the at least one via. In an embodiment, the at least one via comprises two or more vias, each of the two or more vias electrically connected to the at least one connector portion. In some embodiments, the at least one connector portion comprises two or more connector portions each contacting a respective one of the two or more vias. In some embodiments, the at least one connector portion comprises a connector portion contacting the two or more vias.

According to an embodiment, a device comprises an image sensor having a plurality of photosensitive regions disposed in a substrate and configured to sense light through a back side of the substrate and a first RDL disposed on a front side of the substrate and having a plurality of first conductive elements disposed in one or more dielectric layers. An application specific integrated circuit (ASIC) die has a second RDL bonded to the first RDL, the second RDL having a plurality of second conductive elements disposed in one or more dielectric layers. A sensor shield is disposed over the back side of the substrate and extending over the image sensor. A plurality of vias each having a first end contacting the sensor shield and extend from the sensor shield through the first RDL and the second RDL to contact at least one of the plurality of second conductive elements at a second end. Each of the plurality of vias each contact at least one of the plurality of first conductive elements. In some embodiment, the device further comprises a mounting pad configured to receive a voltage signal and conduct the voltage signal to the sensor shield through the plurality of vias to bias the sensor shield. The sensor shield comprises a grid having pixel openings disposed over each of the plurality of photosensitive regions and grid elements disposed between ones of the plurality of photosensitive regions. The sensor shield further comprises a boundary shield electrically connected to the grid, where a bias applied to the sensor shield through the plurality of vias biases the grid and the boundary shield. In some embodiments, the grid elements extend into the substrate. In an embodiment, an isolation layer is disposed in openings in the substrate, with the plurality of vias extending through the openings in the substrate, and with the isolation layer insulating the plurality of vias from the substrate. In an embodiment, the device further comprises a cap layer disposed on the back side of the substrate, and the sensor shield is disposed on the cap layer. The cap layer has at least one opening over the at plurality of vias, the sensor shield extending through the opening and contacting each of the plurality of vias. A backside anti-reflective coating (BARC) is disposed on the backside of the substrate, with the cap layer disposed over the BARC.

A method of forming a device according to an embodiment, comprises providing a sensor die having photosensitive regions disposed in a substrate and a first redistribution layer (RDL) formed on a front side of the substrate, the first RDL having first conductive elements disposed therein. The photosensitive regions are configured to detect light through a back side of the substrate. The method further comprises providing an application specific integrated circuit (ASIC) die, the ASIC die having a second RDL with second conductive elements disposed therein. The sensor die is bonded to the ASIC die by bonding the first RDL to the second RDL, and at least one via opening is formed extending from a back side of the substrate through the first RDL and into the second RDL. The at least one via opening exposes at least one second conductive element. At least one via is formed in the at least one via opening and contacts at least one second conductive element. A sensor shield is formed over the back side of the substrate, the sensor shield extending over the photosensitive regions and contacting the at least one via. In an embodiment, the method further comprises forming a cap layer over the back side of the substrate, the cap layer having at least one opening disposed over the at least one via. In some embodiments, forming the sensor shield comprises forming the sensor shield over the cap layer, at least one connector portion of the sensor shield extending through the at least one opening and contacting the at least one via. The at least one via comprises two or more vias. The cap layer has two or more openings and each of two or more connector portions of the sensor shield extend through respective ones of the two or more openings to contact a respective one of the two or more vias. In an embodiment, the at least one via comprises two or more vias and a connector portion of the sensor shield extends through an opening in the cap layer to contact the two or more vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a device, the method comprising:
providing a sensor die having photosensitive regions disposed in a substrate and a first redistribution layer (RDL) structure formed on a front side of the substrate, the first RDL structure having first conductive elements disposed therein, wherein the photosensitive regions are configured to detect light through a back side of the substrate;

providing an application specific integrated circuit (ASIC) die, the ASIC die having a second RDL structure with second conductive elements disposed therein;

bonding the sensor die to the ASIC die by bonding the first RDL structure to the second RDL structure;

forming at least one via opening extending from the back side of the substrate through the first RDL structure and into the second RDL structure, the at least one via opening exposing at least one second conductive element;

forming at least one via in the at least one via opening and contacting the at least one second conductive element; and forming a sensor shield over the back side of the substrate, the sensor shield extending over the photosensitive regions and contacting the at least one via, the sensor shield having openings over the photosensitive regions.

2. The method of claim 1, further comprising:
forming a cap layer over the back side of the substrate, the cap layer having at least one opening disposed over the at least one via,
wherein the forming the sensor shield comprises forming the sensor shield over the cap layer, at least one connector portion of the sensor shield extending through the at least one opening and contacting the at least one via.

3. The method of claim 2, wherein the at least one via comprises two or more vias;
wherein the cap layer has two or more openings; and
wherein each of two or more connector portions of the sensor shield extend through respective ones of the two or more openings to contact a respective one of the two or more vias.

4. The method of claim 2, wherein the at least one via comprises two or more vias; and
wherein a connector portion of the sensor shield extends through an opening in the cap layer to contact the two or more vias.

5. The method of claim 1, further comprising:
forming a mounting pad opening, the mounting pad opening extending to the at least one second conductive element; and
forming a mounting pad in the mounting pad opening.

6. The method of claim 5, wherein forming the mounting pad opening is performed after forming the sensor shield.

7. A method of forming a device, the method comprising:
forming a first opening through a first substrate, the first substrate having a photosensitive region, the photosensitive region comprising a plurality of pixels, the first substrate having first metallization layers on a first side, the first substrate being bonded to a second substrate, the second substrate having second metallization layers on a first side of the second substrate, the first metallization layers and the second metallization layers being interposed between the first substrate and the second substrate;
forming an isolation layer on a second side of the first substrate and along sidewalls of the first opening;
forming a second opening through the isolation layer and to a first conductive element in the second metallization layers;
forming a first conductive material in the first opening and the second opening, thereby forming a first via;

forming a cap layer over the isolation layer on the second side of the first substrate;
patterning the cap layer to expose the first via;
forming a conductive layer over the cap layer, the conductive layer extending through the cap layer to the first via; and
patterning the conductive layer and the cap layer to form a grid over the photosensitive region and a connector over the first via.

8. The method of claim 7, wherein forming the first opening comprises forming the first opening to extend completely through the first substrate.

9. The method of claim 7, wherein forming the second opening comprises etching the second opening in a bottom of the first opening to expose a second conductive element in the first metallization layers.

10. The method of claim 7, further comprising:
after forming the cap layer, forming a third opening, the third opening exposing a third conductive element; and
filling the third opening with a second conductive material, the second conductive material in the third opening being electrically coupled to the first via.

11. The method of claim 10, wherein the third conductive element and the first conductive element are a same conductive element.

12. The method of claim 7, further comprising:
forming a second via extending through the first substrate, wherein after patterning the conductive layer, remaining portions of the conductive layer electrically couple the first via to the second via.

13. The method of claim 12, wherein the patterning the cap layer comprises forming a first cap opening exposing the first via and a second cap opening exposing the second via, and wherein the conductive layer extends through the first opening and the second opening.

14. The method of claim 13, wherein the first opening and the second opening are along a periphery of the photosensitive region.

15. A method of forming a device, the method comprising:
forming a first opening and a second opening through a first substrate, the first substrate having a photosensitive region, the photosensitive region comprising a plurality of pixels;
forming an isolation layer on a backside of the first substrate and along sidewalls of the first opening and the second opening;
forming a third opening and a fourth opening through the isolation layer along a bottom of the first opening and the second opening, respectively, the third opening and the fourth opening exposing a first conductive element, the first substrate being interposed between the isolation layer and the first conductive element;
forming a first via in the first opening and a second via in the second opening;
forming a cap layer over the isolation layer on the backside of the first substrate;
patterning the cap layer to expose the first via and the second via;
forming a conductive layer over the cap layer, the conductive layer extending through the cap layer to the first via and the second via; and
patterning the conductive layer and the cap layer to form a grid over the photosensitive region and a connector over the first via and the second via.

16. The method of claim 15, further comprising:
forming a mounting pad opening in the first substrate;

forming one or more fifth openings extending from a bottom of the mounting pad opening to a second conductive element; and forming a conductive material in the one or more fifth openings, thereby forming a mounting pad.

17. The method of claim 16, wherein the first conductive element and the second conductive element are a same conductive element.

18. The method of claim 15, wherein the first conductive element is coupled to a ground node.

19. The method of claim 15, wherein the first conductive element is coupled to a bias voltage node.

20. The method of claim 15, wherein after forming the conductive layer, a portion of the cap layer remains between the first via and the second via in a plan view.

* * * * *